US009960262B2

(12) United States Patent
Schultz et al.

(10) Patent No.: US 9,960,262 B2
(45) Date of Patent: May 1, 2018

(54) GROUP III—NITRIDE DOUBLE-HETEROJUNCTION FIELD EFFECT TRANSISTOR

(71) Applicant: Raytheon Company, Waltham, MA (US)

(72) Inventors: Brian D. Schultz, Lexington, MA (US); Eduardo M. Chumbes, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/052,977

(22) Filed: Feb. 25, 2016

(65) Prior Publication Data

US 2017/0250273 A1 Aug. 31, 2017

(51) Int. Cl.

*H01L 29/778* (2006.01)
*H01L 29/205* (2006.01)
*H01L 29/20* (2006.01)
*H01L 29/207* (2006.01)

(52) U.S. Cl.

CPC ...... *H01L 29/7783* (2013.01); *H01L 29/2003* (2013.01); *H01L 29/207* (2013.01)

(58) Field of Classification Search

CPC ........... H01L 29/2003; H01L 29/66462; H01L 29/7786; H01L 29/205; H01L 29/7787
USPC .......... 257/194, E29.246–E29.253, E21.403, 257/E21.407; 438/167, 172
See application file for complete search history.

(56) References Cited

U.S. PATENT DOCUMENTS 5,192,987 A 3/1993 Khan et al.
6,316,793 B1 11/2001 Sheppard et al.
7,098,490 B2 8/2006 Micovic et al.
7,851,284 B2 12/2010 Zhang et al.
8,080,833 B2 12/2011 Grandusky et al.
(Continued)

OTHER PUBLICATIONS

Maeda et al. *Enhanced Effect of Polarization on Electron Transport Properties in AlGaN/GaN Double Heterostructure Field Effect Transistors*, Appl. Phys. Lett. 76, 3118 (2000), pp. 3118-3120 (3 pages).
(Continued)

*Primary Examiner* — Jonathan Han
(74) *Attorney, Agent, or Firm* — Daly, Crowley, Mofford & Durkee, LLP

(57) ABSTRACT

A semiconductor structure having a buffer layer, a pseudomorphic, impurity doped, back-barrier layer disposed on the buffer layer, a channel layer disposed on the back-barrier layer, the channel layer lattice matched to the buffer layer, and a top barrier layer disposed on the channel layer. A Group III-Nitride transition layer is disposed between the buffer layer and the pseudomorphic back-barrier layer. The buffer layer and the pseudomorphic back-barrier layer are both Group III-Nitride materials. The Group III-Nitride material of the buffer layer is different from the Group III-Nitride material in the back-barrier layer. The back-barrier layer has a wider bandgap of than the buffer layer bandgap. The composition of the Group III-Nitride material in the transition layer varies from the composition of the Group III-Nitride material in the buffer layer to the composition of the Group III-Nitride material in the pseudomorphic back-barrier layer as a function of distance from the buffer layer.

32 Claims, 3 Drawing Sheets

(56) References Cited

U.S. PATENT DOCUMENTS

| | | | | |
|---|---|---|---|---|
| 8,633,569 | B1 * | 1/2014 | Arkun | H01L 21/02381 257/11 |
| 9,231,064 | B1 | 1/2016 | Reza et al. | |
| 2014/0231876 | A1 * | 8/2014 | Tsai | H01L 29/66318 257/195 |
| 2014/0239307 | A1 * | 8/2014 | Dargis | H01L 21/02192 257/76 |
| 2015/0021660 | A1 * | 1/2015 | Chen | H01L 29/66462 257/190 |
| 2015/0069409 | A1 * | 3/2015 | Dargis | H01L 21/02433 257/76 |

OTHER PUBLICATIONS

Zervos et al. *Investigation into the Charge Distribution and Barrier Profile Tailing in AlGaN/GaN Double Heterostructures by Self-Consistent Poisson-Schrödinger Calculations and Capacitance-Voltage Profiling*, J. Appl. Phys. 91, 4387 (2002), pp. 4387-4393 (7 pages).

Chu et al. *AlGaN—GaN Double-Channel HEMTs*, IEEE Trans. Electron Devices 52, 438 (2005). pp. 438-446 (9 pages).

Z. Fan et al. AlGaN/GaN double heterostructure channel modulation doped field effect transistors (MODFETs), Electronic Letters, vol. 33, No. 9, 814 (Apr. 24, 1997), pp. 814-815 (2 pages).

X.-D.Wang et al. The Study of Self-Heating and Hot-Electron Effects for AlGaN/GaN Double-Channel HEMTs, IEEE Transactions on Electron Devices, 59(5), 1393-1401, May 2012, pp. 1393-1401 (9 pages).

T. Palacios et al., Use of Double-Channel Heterostructures to Improve the Access Resistance and Linearity in GaN-Based HEMTs, IEEE Transactions on Electron Devices, 53(3), 562 (Mar. 2006) pp. 562-565 (4 pages).

Micovic, Miroslav, et al., "GaN double heterojunction field effect transistor for microwave and millimeterwave power applicatons," Electron Devices Meeting, 2004. IEDM Technical Digest. IEEE International. IEEE, 2004, pp. 33.4.1-33.4.4 (4 pages).

J. Liu et al. "AlGaN/GaN/InGaN/GaN DH-HEMTs with an InGaN notch for enhanced carrier confinement" Electron Device Letters, IEEE 27.1 (2006): pp. 10-12 (3 pages).

X. Gao et al., A Statistical Study of AlGaN/GaN HEMT Uniformity with Various Buffer and Barrier Structures, CS MANTECH Conference, May 16-19, 2011, Palm Springs, California, 4 pages.

Y.-J. Lee et al., High breakdown voltage in AlGaN/GaN HEMTs using AlGaN/GaN/AlGaN quantum-well electron-blocking layers, Nanoscale Research Letters, 9, 433 (2014) pp. 1-9 (9 pages).

X. Kong, et al., Improved Performance of Highly Scaled AlGaN/GaN High-Electron-Mobility Transistors Using an AIN Back Barrier, Applied Physics Express, 6, 051201 (2013), 4 pages.

X. Wang et al., Effect of GaN Channel Layer Thickness on DC and RF Performance of GaN HEMTs With Composite AlGaN/GaN Buffer, IEEE Transactions on Electron Devices, 61(5), 1341 (May 2014). pp. 1341-1346, (6 pages).

S.L. Zhao et al., Analysis of the Breakdown Characterization Method in GaN-Based HEMTs, IEEE Transactions on Power Electronics, 31(2), 1517 (Feb. 2016),pp. 1517-1527 (11 pages).

P. Ivo et al., Comparative study of AlGaN/GaN HEMTs robustness versus buffer design variations by applying Electroluminescence and electrical measurements, Microelectronics Reliability, 51, 217-223 (2011) pp. 217-233 (7 pages).

F. Medjdoub et al., Effects of AlGaN Back Barrier on AlN/GaN-on-Silicon High-Electron-Mobility Transistors, Applied Physics Express, 4, 124101 (2011), 3 pages.

E.Bahat-Treidel et al., Punchthrough-Voltage Enhancement of AlGaN/GaN HEMTs Using AlGaN Double-Heterojunction Confinement, IEEE Transactions on Electronic Devices, 55(12), 3354, (Dec. 2008), pp. 3354-3359 (6 pages).

H.-S. Lee et al., 3000-V 4.3-mΩ• cm2 InAlN/GaN MOSHEMTs With AlGaN Back Barrier, IEEE Electron Device Letters, 33(7), 982 (Jul. 2012), pp. 982-984 (3 pages).

Y. Cordier et al., AlGaN/GaN/AlGaN DH-HEMTs grown by MBE on Si(111), J. of Crystal Growth, 278, 393-398 (2005). pp. 393-396 (4 pages).

L. Ravikiran et al., Growth and characterization of AlGaN/GaN/AlGaN double-heterojunction high-electron-mobility transistors on 100-mm Si(111) using ammonia-molecular beam epitaxy, J. of Applied Physics, 117, 025301 (2015), 7 pages.

G. Meneghesso et al., Breakdown mechanisms in AlGaN/GaN HEMTs: An overview, Japanese Journal of Applied Physics 53, 100211 (2014), 8 pages.

Ambacher et al., Two-dimensional electron gases induced by spontaneous and piezoelectric polarization charges in N- and Ga-face AlGaN/GaN heterostructures, Journal of Applied Physics, Mar. 15, 1999, vol. 85, No. 6, pp. 3222-3233.

* cited by examiner

GROUP III—NITRIDE DOUBLE-HETEROJUNCTION FIELD EFFECT TRANSISTOR

TECHNICAL FIELD

This disclosure relates generally to high electron mobility transistors (HEMTs) and more particularly to Group III-Nitride HEMTs.

BACKGROUND

As is known in the art, high electron mobility transistors (HEMTs) generally include a substrate having a channel layer located between a buffer layer adjacent to the substrate side of the HEMT and a barrier layer. The barrier is composed of a different material than the channel layer and a heterojunction is formed at the channel layer/barrier layer interface with a highly conductive two-dimensional electron gas (2DEG) residing on the channel side of the heterojunction or interface. Generally the barrier layer has a wider bandgap than the channel material and charge is transferred to the channel layer from the addition of donor impurities and/or polarization differences at the heterojunction. The buffer layer can either be of the same material as the channel layer or a different material. Structures where the buffer layer and channel layer are of the same material are referred to as single heterojunction structures. Structures Where the buffer layer and channel layer are of different materials are referred to as double heterojunction structures or double channel HEMT structures.

Indium Nitride (InN), Gallium Nitride (GaN), Aluminum Nitride (AlN), Boron Nitride (BN) and all of their associated alloys including $In_x(Al_yGa_{1-y})_{1-x}N$ (where $0 \le x \le 1$ and $0 \le y \le 1$) and $B_z(In_x(Al_yGa_{1-y})_{1-x})_{1-z}N$ (where $0 \le x \le 1$ and $0 \le y \le 1$ and $0 \le z \le 1$) are a family of materials known as Group III-Nitrides. The Group III-Nitrides are used in power and microwave transistor device electronics in part because of their breakdown voltages, bandgap energies, and saturation velocities. One of the principal issues related to device performance is the crystal quality of the epitaxial material grown from Group III-Nitride materials as most epitaxial Group III-Nitride heterostructures are grown on lattice mismatched substrates due to the high cost and low availability of large diameter bulk Group III-Nitride substrates. The lattice mismatch results in the formation of numerous defects detrimental to device performance. Typically Group III-Nitride buffer layers are grown in excess of one micron in thickness before the active device regions are grown to allow the material to relax and to reduce as many defects as possible through the growth process.

Group III-Nitride materials in the wurtzite crystal structure exhibit spontaneous and piezoelectric polarization due in part to structural deviations from the ideal tetrahedral coordination along the (0001) axis (c-axis) and differences in the electronegativity between the bonded group III and nitrogen atoms. When the crystal undergoes a distortion due to an applied strain that changes the axial ratio (ratio of the lattice constants c/a), the polarization of the crystal is impacted.

Many Group III-Nitride device structures take advantage of the polarization mismatches that occur when two different Group III-Nitride materials are epitaxially bonded together to produce electrically active carriers at these heterojunctions. The polarization mismatch at the heterojunction induces a sheet charge at the heterojunction. If the polarization induced sheet charge density is positive, free electrons will tend to compensate the polarization induced charge, and if the band offsets at the junction are large enough, a two-dimensional electron gas or 2DEG will form as in the case of the AlGaN/GaN heterojunction.

If the two Group III-Nitride materials comprising a heterojunction are fully relaxed with their respective bulk equilibrium lattice constants, then the difference in the total polarization mismatch is equal to the differences in their respective spontaneous polarizations. If the in-plane lattice constant mismatch between an epitaxial layer and an underlying layer at a heterojunction results in the expansion or contraction of one of the layers, the induced piezoelectric polarization will also contribute to the total polarization.

As is also known in the art, there is a need for heterojunction Group III-Nitride HEMTs which confine the 2DEG charge in the channel layer, while maintaining low off-state leakage and good Radio Frequency (RF) performance. Typically in single heterojunction Group III-Nitride based HEMT structures the buffer layer may have multiple materials near the substrate, to reduce defect propagation and control strain, and a single partially or fully strain relaxed material adjacent to the channel layer. The channel layer is generally a continuation of the buffer layer and of the same material as the buffer layer adjacent to the channel layer.

As is also known, Group III-Nitride materials are very strong polar materials with large polarization constants. This strength comes from the strong electronegativity property of the nitrogen atom and the wurtzite crystalline structure these materials naturally form.

As is also know, RF transistors using the Group III-Nitride materials are typically based AlGaN/GAN heterostructure where at the GaN side of the AlGaN/GaN heterojunction, interface, a 2DEG forms to compensate the net polarization charge created by the polarization discontinuity that exists at that heterojunction. This 2DEG is the source of the RF transistor current of this structure. In the AlGaN/GaN heterostructure, the is the topside barrier separating the heterojunction from the gate electrode while the GaN serves as the channel for which this mobile charge resides. The bandgap of the topside barrier is always larger than the channel layer to mitigate 2DEG spreading into the barrier. In a common source configuration, the potentials at the gate and drain electrodes (the source is typically grounded) of the AlGaN/GaN RF transistor under any operation (on- or off-state, high or low-voltage) cause the mobile sheet charge to spread into the bulk. The degree of the spreading depends highly on the gate and drain voltages applied with the spread being largest under near off-state conditions at high drain voltages. This unfortunately is the nominal desired operating conditions for high-power amplifiers. Therefore, this spreading is undesired as it brings deleterious effects such as mobility reduction by scattering and charge loss by trapping via defects and impurities in the bulk of the material. Both of which impact overall gain and power performance under RF operation. In the conventional AlGaN/GaN single heterojunction structures described above, the AlGaN barrier is strained while the GaN channel where the 2DEG resides is not strained.

Prior attempts to confine the charge have utilized a double heterojunction back-barrier design whereby the band structures of the materials are such that the conduction band of the channel layer is lower than both the top barrier layer and the back-barrier layer at the respective heterojunctions. The charge in the channel is then confined by the top and back-barrier layers. Two types of double heterojunction back-barrier HEMTs have generally been used. The first type incorporates a thick back-barrier buffer layer where the crystal structure of the back-barrier layer is partially or fully relaxed and the substrate side of the heterojunction does not contribute to the current in the channel. This structure is shown in FIG. 1 and will be referred to as a single channel double heterojunction back-barrier HEMT. The second type incorporates a thin back bather layer where the polarization field in the back-barrier creates a second source of electron carriers away from the channel layer. Although this structure, as shown in FIG. 2, confines a 2DEG near the surface, it typically leads to the formation of a second 2DEG that is not confined. This structure is, as noted above, also commonly referred to as a double channel HEMT.

As is also known in the art, exact in-plane lattice matched conditions are difficult to achieve in heterojunctions having epitaxial growth and as a result there usually exists some degree of in-plane mismatch between different layers. When an epitaxial layer is grown on a crystalline substrate or on one or more epitaxial layers with a defined crystallinity, the in-plane lattice of the epitaxial layer will initially conform to match the in-plane lattice constant of the underlying material. However, the epitaxial layer experiences a tensile or compressive in-plane strain as it attempts to conform to the underlying in-plane lattice and the strain energy of the epitaxial layer increases until it becomes large enough to nucleate misfit dislocations. The formation of misfit crystal dislocations reduces the strain in the epitaxial layer and allows the in-plane lattice parameter to relax towards its bulk lattice structure above the interface. The thickness at which misfit dislocations are nucleated to relieve the strain in the epitaxial layer is known as the critical thickness for the layer. The larger the in-plane lattice mismatch, the smaller the critical thickness of the epitaxial layer. When the thickness of the epitaxial layer is less than the critical thickness, the epitaxial layer is said to be pseudomorphic. For Group III-Nitride based transistors, nearly matched in-plane lattices are desired between various layers to minimize misfit dislocations and defect formations.

In the case of single channel double heterojunction back-barrier HEMTs, a thick back-barrier layer is used where the back-barrier layer is partially or fully relaxed and the substrate side of the junction does not contribute significantly to the current in the channel. This case is similar to the single heterojunction HEMT with the exception that the material in the buffer layer adjacent the channel layer is different than the material in the channel layer. In this case, the material in the buffer layer adjacent the channel layer is the back-barrier layer. In this case, there is a lattice mismatch at the channel layer/back-barrier layer heterojunction and the in-plane lattice constant of the channel layer material adjusts to have the lattice parameter of the underlying back barrier layer to minimize defect formation. The channel layer and the top barrier layer are grown pseudomorphic and that the two layers are strained so that their in-plane lattice parameters match the in-plane lattice parameter of the back-barrier layer.

In the case of the dual channel double heterojunction back-barrier HEMT, the back bather layer no longer serves the role of the buffer layer and is an additional layer located between the buffer layer and the channel layer. In this case the buffer layer and Channel layer are generally the same material and insertion of the back-barrier layer creates additional heterojunctions with both the buffer layer and the channel layer. The in-plane lattice constant of this back barrier layer will adjust to have the in-plane lattice parameter of the underlying buffer layer material to minimize defect formation. Unlike the case of the single channel back-barrier double heterojunction HEMT, the channel layer in these devices is generally the same material as the buffer layer and is therefore lattice matched to the buffer layer. The bather layer on the surface side of the channel layer, a so-called top harrier layer (FIG. 2), and the back-barrier layer are strained to maintain the in-plane lattice parameter of the buffer layer. The back-barrier layer and the top barrier layer are grown pseudomorphic in that the two layers are strained so that their in-plane lattice parameters match the in-plane lattice parameter of the buffer layer. In this case, the back-barrier layer confines a 2DEG near the surface, but the additional heterojunction created at the buffer layer/back-barrier layer interface also creates a polarization mismatch leading to the formation of additional charge carriers outside of the confined channel layer. These additional charge carriers can lead to the formation of a second 2DEG. As shown in FIG. 2 these structures contain two channel layers. The first 2DEG is formed by the top barrier/channel layer heterojunction and the electrons are located primarily in first/top channel layer and confined by the top and back-barrier layers. The second 2DEG is formed by the back-barrier/buffer layer heterojunction and the electrons are located primarily in the buffer layer, which also serves as a second/bottom channel layer, and confined only by the back-barrier layer. Double channel HEMTs can produce large negative threshold voltage shifts, lower transconductance leading to lower gain performance and unwanted parasitic currents. Although these properties may be desirable in some device configurations, they minimize the benefits of the charge confinement.

The carrier concentrations of a semiconductor material may be manipulated during the fabrication process with the addition of impurity atoms, a process commonly referred to as doping. The impurities add allowed energy states in the bandgap of the semiconductor. The impurities which produce allowed states close to the conduction band, typically within a few 100 milli-electron volts (meV), are commonly referred to as donor impurities or n-type dopants. At room temperature the thermal energy is sufficient to excite electrons from the states produced by the donor impurities into the conduction band. Similarly, impurities which produce allowed states close to the valance band, typically within a few 100 meV, are commonly referred to as acceptor impurities or p-type dopants as these allow valance electrons to be thermally excited into the acceptor states producing holes in the valance band. Impurities that produce states in the bandgap that are separated from either the conduction band edge or the valance band edge by more than a few 100 meV are commonly referred to as deep-level impurities. Deep-level impurities can be acceptor-like, donor-like, or may exhibit multiple charge states within the bandgap.

SUMMARY

In accordance with the present disclosure, a semiconductor structure is provided having: a buffer layer; a pseudomorphic back-barrier layer disposed on the buffer layer; a channel layer disposed on the back-barrier layer, the channel layer being lattice matched to the buffer layer; a top barrier layer disposed on the channel layer; and wherein the pseudomorphic back-barrier layer is doped with impurities.

In one embodiment, the impurities are carbon, magnesium, beryllium, or iron or combinations thereof.

In one embodiment, the impurities are of a type to reduce carrier transport within the back-barrier layer.

In one embodiment, the impurities are p-type impurities.

In one embodiment, the pseudomorphic back-barrier layer is AlGaN.

In one embodiment, the pseudomorphic back-barrier layer is AlGaN and the impurities are carbon, magnesium, beryllium, or iron, or combinations thereof.

In one embodiment, the pseudomorphic back-barrier layer is AlGaN and the impurities are of a type to reduce carrier transport within the back-barrier layer.

In one embodiment, the pseudomorphic back-barrier layer is AlGaN and the impurities are p-type impurities.

In one embodiment, a semiconductor structure is provided having; a buffer; a pseudomorphic back-barrier layer disposed on the buffer layer; a single channel layer disposed on the back-barrier layer, the channel layer being lattice matched to the buffer layer; and a top barrier layer disposed on the channel layer.

In one embodiment, a Group III-Nitride transition layer is provided between the buffer layer and the pseudomorphic back-barrier layer; wherein the buffer layer and the pseudomorphic back-barrier layer are both Group III-Nitride materials; wherein the Group III-Nitride material of the buffer layer is different from the Group III-Nitride material in the back-barrier layer; wherein the back-barrier layer has a wider bandgap of than the buffer layer bandgap; wherein the Group III-Nitride material in the transition layer varies from the Group III-Nitride material in the buffer layer to the Group III-Nitride material in the pseudomorphic back-barrier layer as a function of increasing distance from the buffer layer.

The inventors have recognized that in the single channel double hetero unction back-barrier HEMT, the back-barrier layer produces additional strain in the channel layer that can lead to additional off-state leakage in transistors as well as poor device reliability. With a semiconductor structure having: a buffer; a pseudomorphic back-barrier layer disposed on the buffer layer; a single channel layer disposed on the back-barrier layer, the channel layer being lattice matched to the buffer layer; and a top barrier layer disposed on the channel layer, a double-heterojunction structure is provided having a single conduction channel resulting in such structure having no additional strain induced into the channel layer due to a lattice mismatch which would occur with a non pseudomorphic back-barrier layer structure described in connection with FIG. 1. To put it another way, in order to prevent charge spreading from occurring, an additional bather layer is introduced below the channel. For example, an AlGaN/GaN structure is modified into an AlGaN/GaN/AlGaN/GaN structure. The composition of the two AlGaN layers in this structure need not be the same. In one embodiment, for example, the composition of the bottom side hairier is typically around 3-8% Al while the composition of the topside barrier is typically around 20-35% Al or higher.

With such an arrangement, the transition layer is inserted between the GaN buffer layer and the AlGaN back-barrier layer to suppress the formation of a secondary electron conduction channel; that is, the transition layer suppresses the formation of any 2DEG charge carrying second channel layer.

In one embodiment, the pseudomorphic back-barrier layer is a single-crystal material and the buffer layer is a single-crystal material different from the pseudomorphic back-barrier layer, the back-barrier layer having a lattice constant different from the lattice constant of the buffer layer, the in-plane lattice constant of the back-barrier layer being matched to the in-plane lattice constant of the buffer layer.

In one embodiment, a semiconductor structure is provided having: a buffer layer; a pseudomorphic hack-bather layer disposed on the buffer layer; a channel layer disposed on the back-barrier layer, the channel layer being lattice matched to the buffer layer; a top barrier layer disposed on the channel layer; a Group III-Nitride transition layer disposed between the buffer layer and the pseudomorphic back-barrier layer; wherein the transition layer suppresses formation of a second 2DEG at the back-barrier/buffer layer heterojunction.

In one embodiment, a semiconductor structure is provided having: a buffer layer; a pseudomorphic back-barrier layer disposed on the buffer layer; a channel layer disposed on the back-barrier layer, the channel layer being lattice matched to the buffer layer; a top barrier layer disposed on the channel layer; a Group III-Nitride transition layer disposed between the buffer layer and the pseudomorphic back-barrier layer; wherein the transition layer includes impurity doping to suppress the generation of free carriers by polarization mismatches across the transition layer.

With such an embodiment, a Group III-Nitride double-heterojunction field effect transistor (FET) is provided having a single conduction channel, a pseudomorphic back-barrier layer, a transition layer between the back-barrier and the buffer layer, and a channel layer lattice-matched to the buffer layer. The back-barrier provides carrier confinement to the 2DEG charge and increases the breakdown voltage of the FET. Pseudomorphic growth of the back-barrier layer keeps additional misfit dislocations from forming due to an in-plane lattice-mismatch. A lattice-matched channel and buffer layer reduce strain in the channel layer. The transition layer is tailored to keep a second 2DEG from forming at the back-barrier/buffer layer heterojunction. Further, the Group III-Nitride based HEMT structure with a pseudomorphically grown back-barrier layer improves confinement of charge in the channel region without creating a second conduction channel elsewhere in the device. Thus, there is no additional strain induced on the channel layer due to an in-plane lattice-mismatch with the back-barrier layer. In one embodiment the buffer layer and the channel layer are the same material. In one embodiment, as noted above, the transition layer between the hack-barrier layer and the buffer layer suppresses the formation of a second 2DEG resulting from a polarization mismatch at the back-barrier/buffer layer heterojunction.

To put it another way, the inventors have recognized an advantage if the 2DEG resides in a channel that is substantially not strained. For that reason a relaxed GaN buffer layer is included below the AlGaN/GaN/AlGaN. The lattice structure of the AlGaN layers alone are strained to match the in-plane lattice parameter of the GaN buffer layer while the GaN channel remains lattice matched to the relaxed GaN buffer. Thus, the transport properties of the 2DEG in this structure should be close to that of the conventional AlGaN/GaN structure but now with the added benefit of charge confinement brought about by the bottom AlGaN harrier.

Still more particularly, to maintain the transport properties and performance of the AlGaN/GaN RF transistor with the added benefit of charge confinement requires that the additional 2DEG at the AlGaN back-barrier/GaN buffer layer heterojunction be eliminated. This is accomplished by inserting a doped, compositionally graded transition layer between the AlGaN back-barrier layer and the GaN buffer layer. The composition grading of the transition layer alone transforms the polarization discontinuity into a polarization grading confined within the transition layer. The mobile charge generated within this transition layer compensates for the polarization grading and the density of the mobile charge is reduced as the thickness of the transition layer is increased. The total combined thickness of the transition layer and the hack-barrier layer can be increased up to the critical thickness. Doping impurities may also be introduced into the transition layer to help compensate for the mobile charge generated within the layer. Examples of p-type and/or deep level doping impurities that would compensate for free electrons generated by the polarization grading includes, carbon, magnesium, beryllium, or iron or combinations thereof. Therefore, in one embodiment, a structure having $Al_xGa_{1-x}N/GaN/Al_yGa_{1-y}N$/transition/GaN where $(0 \leq x \leq 1)$ and $(0<y \leq 1)$ and the transition layer is doped with p-type and/or deep level impurities and compositionally graded from $Al_yGa_{1-y}N$ to GaN over a distance of 5-100 nm.

In one embodiment a pseudomorphic AlGaN back-barrier layer is greater than 50 nm in thickness enabling the transition layer to be located more than 50 nm from the 2DEG in the channel layer.

In one embodiment the pseudomorphic AlGaN back-barrier layer is doped with p-type and/or deep level doping impurities, such as carbon, magnesium, beryllium, or iron or combinations thereof, over part or the whole back-barrier layer to reduce carrier transport within the back-barrier layer. The doping compensates for any mobile carriers that may exist in the back-barrier layer and reduces off state leakages in HEMT devices.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figures 1, 2:
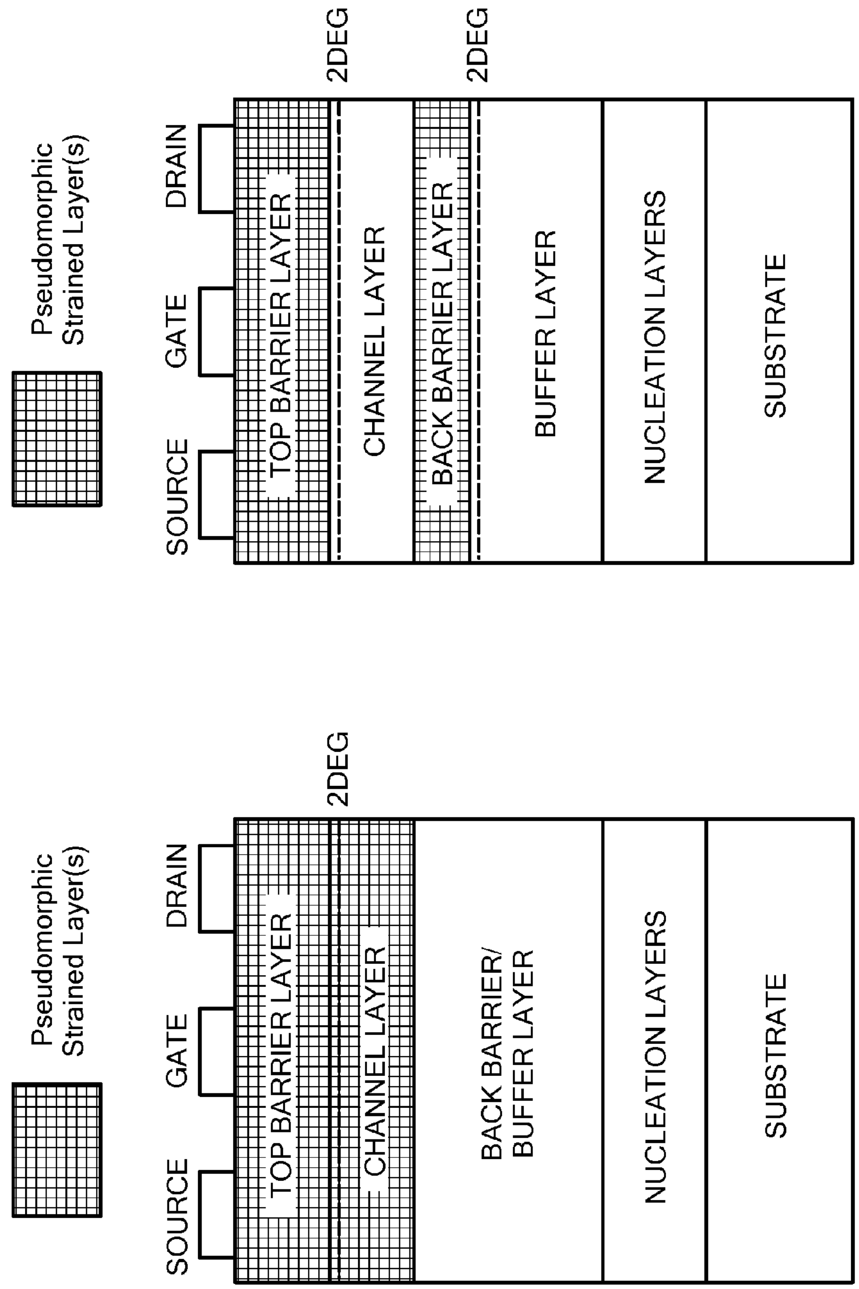
FIG. 1 is a diagrammatical cross section of a back-barrier double heterojunction HEMT according to the PRIOR ART.
FIG. 2 is a diagrammatical cross section of a double channel heterojunction HEMT according to the PRIOR ART.
Figure 3:
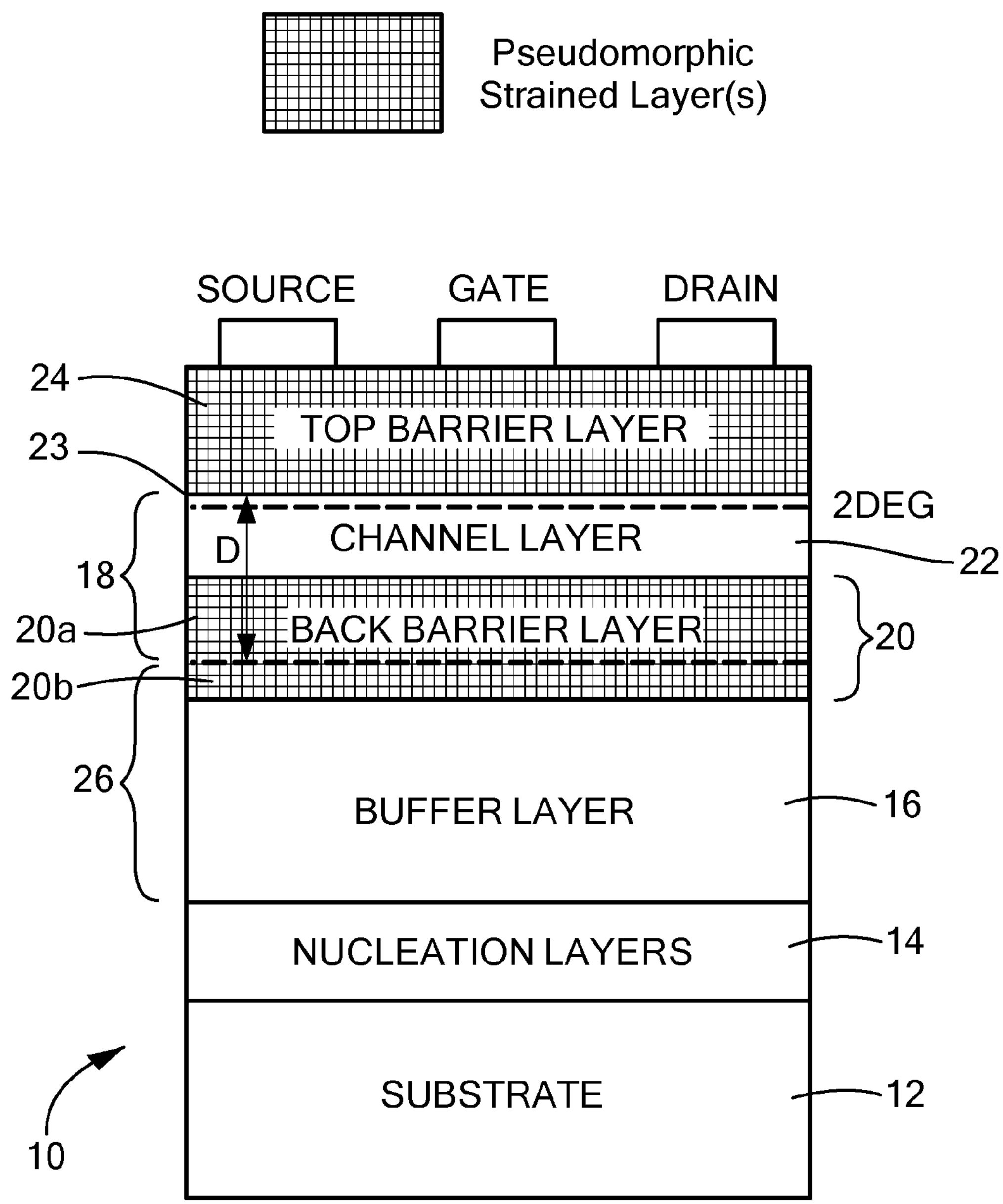
FIG. 3 is a diagrammatical cross section of a pseudomorphic back-barrier double heterojunction. HEMT according to the disclosure.

Referring now to FIG. 3, a pseudomorphic back-barrier double heterojunction HEMT structure 10 is shown. The structure 10 includes a substrate 12, here for example, silicon carbide (SiC), silicon (Si) or sapphire, having a nucleation layer structure 14 deposited on the substrate. The nucleation layer structure 14 helps transition between various bonding, lattice, and polycrystalline type mismatches that exist between the substrate 12 and a buffer layer structure 16. The nucleation layer structure 14 can be a few atomic layers or include multiple material layers over microns of epitaxial growth. The buffer layer structure 16 includes one or more Group III-Nitride materials, such as GaN or a superlattice of Al(Ga)N and GaN, for example, near the substrate 12, to reduce defect propagation and control strain, and a single partially or fully strain relaxed material, such as GaN, for example. The buffer layer structure 16 may include any suitable conventional dopant, such as carbon, magnesium, beryllium, or iron or combinations thereof, for example, to form an insulating region.

The pseudomorphic back-barrier double heterojunction HEMT structure 10 also includes a pseudomorphically strained back-barrier layer 20 deposited between the buffer layer structure 16 and a channel layer 22. The back-barrier layer 20 typically includes a wider bandgap material than the channel layer 22 to provide carrier confinement to the channel layer 22. The back-barrier layer 20 is gown pseudomorphically on the buffer layer and is kept thin enough to prevent the formation of misfit dislocations due to the in-plane lattice mismatch between the back-barrier layer 20 and the buffer layer 16; thinner than the critical thickness. The back-barrier layer 20 is grown pseudomorphic and is strained so that the in-plane lattice parameter matches the in-plane lattice parameter of the material in buffer layer 16 adjacent to the back-barrier layer.

The channel layer 22 has the same in-plane lattice parameter as the material in the buffer layer 16 adjacent to the back-barrier layer 20. A top barrier layer 24 forms a heterojunction 23 with the channel layer 22 that creates a polarization mismatch resulting in the formation of a 2DEG in the channel layer 22. The top barrier layer 24 is grown pseudomorphically on the channel layer 22 and is kept thin enough to prevent the formation of misfit dislocations due to the in-plane lattice mismatch with the channel layer 22; thinner than the critical thickness. Thus, the lattice structure of the top barrier layer 24 is strained to match the in-plane lattice constant of the channel layer 22 and the total thickness of the top barrier layer 24 is less than the thickness at which misfit dislocations are nucleated to relieve strain in the top barrier layer 24 resulting from the in-plane lattice mismatch with the channel layer 22. To put it another way, the top barrier layer 24 is grown epitaxially with a thickness less than the thickness at which misfit dislocations are nucleated to relieve strain in the epitaxial layer.

The HEMT device structure includes source, drain, and gate, electrodes, as shown in FIG. 3. The gate electrode controls the flow of the carriers passing through the channel layer 22, depending on the bias voltage, between the source, gate, and drain electrodes. It should be understood that it is the polarization mismatch at the top barrier layer 24 and the channel layer 22 heterojunction that is responsible for producing the 2DEG and the top barrier layer 24 separates the junction from a gate contact used to modulate the charge in the 2DEG. The top barrier layer 24 may be of one or more Group III-Nitride materials with compositions that remain fixed or vary with distance from the heterojunction between the top barrier layer 24 and the channel layer 22. The gate contact may be directly deposited on a Group III-Nitride material in the top bather layer 24 or separated from a Group III-Nitride material in the top barrier layer 24 by one or more electrically insulating layers, not shown.

More particularly, the pseudomorphic back-barrier double heterojunction HEMT structure 10 is here a Group III-Nitride HEMT having a SiC substrate 12 in the (0001) crystallographic orientation. HEMT 10 includes a nucleation layer 14, here for example, a 10-100 nanometers (nm) thick, epitaxially grown, Aluminum Nitride (AlN) nucleation layer, a buffer layer structure 16, here for example, a 1.0-2.0 μm thick, epitaxially grown Gallium Nitride (GaN) buffer layer, a back-barrier layer 20, here for example, a 125 nm thick, epitaxially grown, back barrier layer of Aluminum Gallium Nitride (AlGaN), here for example, having 5% Aluminum (Al), a channel layer 22, here for example, a 10-100 nm thick GaN channel layer, a top barrier layer 24, here a 20-25 nm thick, unintentionally doped (UID) during the epitaxial growth, Aluminum Gallium Nitride (AlGaN) layer having here for example, 25-35% Aluminum (Al). The pseudomorphic AlGaN back-barrier layer 20 is doped with p-type and/or deep level doping impurities, such as carbon, magnesium, beryllium, or iron or combinations thereof, over part or the whole back-barrier layer 20 to reduce carrier transport within the back-barrier layer. It is noted that the doping may be uniform or non-uniform. It is also noted that the doping may be displaced from the channel layer to minimize the effect of the dopant in degradation of RF performance.

The gate electrode controls the flow of the carriers passing through the GaN channel layer 22, depending on the bias voltage, between the source, gate, and drain electrodes. It should be understood that it is the polarization mismatch at the AlGaN layer 24 and the GaN channel layer 22 heterojunction that is responsible for producing the 2DEG and the AlGaN layer 24 separates the junction from a gate contact used to modulate the charge in the 2DEG. The aluminum composition of the AlGaN layer 24 may remain fixed or vary with distance from the heterojunction between the AlGaN layer 24 and the GaN channel layer 22. The gate contact may be directly deposited on the AlGaN layer 24 or separated from the AlGaN layer 24 by a 1-3 nm GaN cap layer, not shown, and/or one or more electrically insulating layers, not shown, for example, aluminum oxide or silicon nitride.

As noted above, the pseudomorphic back-barrier layer 20 is doped with p-type and/or deep level doping impurities, such as carbon or, magnesium, or beryllium, or iron, or a combination of such dopants, over part or the whole back-barrier layer to reduce carrier transport within the back-barrier layer and lower the of state device leakage.

A region 26 having intentional p-type and/or deep level impurities, such as carbon, magnesium, beryllium, or iron, or a combination of such dopants, to reduce carrier transport and make the material more insulating is formed during the epitaxial growth process. The doping can be uniform or non-uniform over the region and typically exceeds $5\times10^{16}$ atoms/$cm^3$ over some part of the region 26. A region 18 is where p-type and/or deep level impurities such as carbon, magnesium, beryllium, or iron, or a combination of such dopants, are not intentionally added during the growth process; that is, conditions and cleanliness of the growth apparatus and impurities in the starting source material introduce unintentional background impurities into the various layers of the heterojunction structure 10. The concentration of these unintentional background impurities is typically at $5\times10^{16}$ atoms/$cm^3$ or below in the region 18 as these impurities can be detrimental to the RF performance of heterojunction structure 10. Region 18 extends a distance D from a heterojunction 23 towards the substrate 12. The heterojunction 23 is formed between the top barrier layer 24 and the channel layer 22. The distance D must be equal to or larger than the thickness of the channel layer 22; here such thickness of the channel layer 22 being typically between 10-100 nm as noted above. The distance D can be larger than the total thickness of the channel layer 22 and the back-barrier layer 20. The distance D can also be larger than the thickness of the channel layer 22 and smaller than the total thickness of the channel layer 22 and the back-barrier layer 20, such that a region of the back-barrier layer 20*b* is included in region 18 and a region of the back barrier layer 20*a* is included in region 26. It should be noted that the channel layer 22 may be doped with an n-type dopant as described in U.S. Pat. No. 9,231,064.

Figure 4:
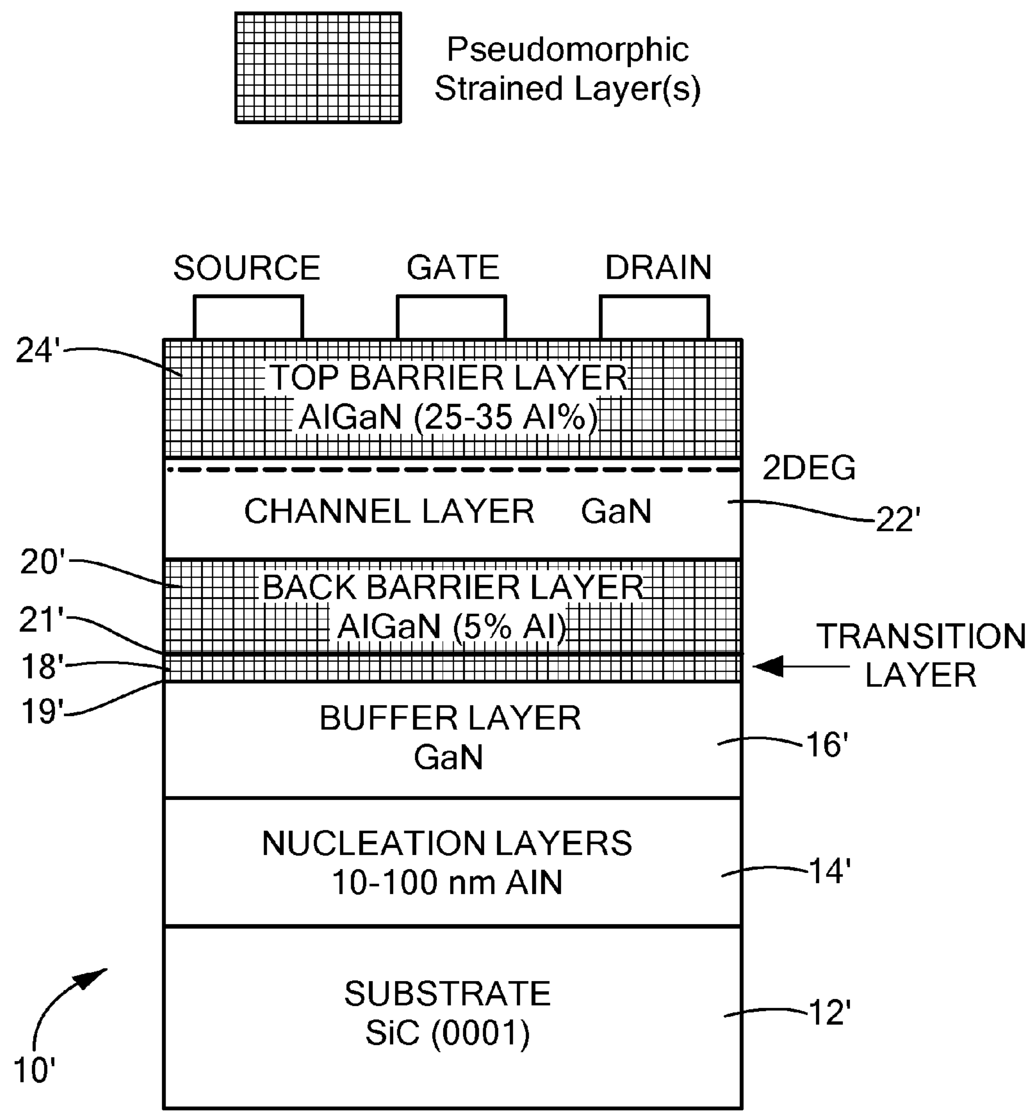
FIG. 4 is a diagrammatical cross section of another pseudomorphic back-barrier double heterojunction HEMT according to the disclosure.

Referring now to FIG. 4, another pseudomorphic back-barrier double heterojunction HEMT structure 10' is shown. The structure 10' is similar to the structure 10 described above with the inclusion of a transition layer 18' to be described in detail below. Thus, the structure 10' includes a substrate 12', here for example, silicon carbide (SiC), silicon (Si) or sapphire, having a nucleation layer structure 14' deposited on the substrate 12'. The nucleation layer structure 14' helps transition between various bonding, lattice, and polycrystalline type mismatches that exist between the substrate 12' and a buffer layer structure 16'. The nucleation layer structure 14' can be a few atomic layers or include multiple material layers over microns of epitaxial growth. The buffer layer structure 16' includes one or more Group III-Nitride materials, such as GaN or a superlattice of Al(Ga)N and GaN, for example, near the substrate 12', to reduce defect propagation and control strain, and a single partially or fully strain relaxed material, such as GaN, for example, adjacent to a transition layer 18'. The buffer layer structure 16' may include any suitable conventional dopant, such as carbon, magnesium, beryllium, or iron or combinations thereof, for example, to form an insulating region.

The transition layer 18' may include a compositionally graded layer and/or be compositionally doped with carbon, magnesium, beryllium, or iron or combinations thereof, for example, to suppress the generation of free carriers by polarization mismatches between back-barrier layer 20' and the buffer layer structure 16'. The transition layer 18' and the back-barrier layer 20' are deposited between the buffer layer structure 16' and a channel layer 22' and are typically wider bandgap materials to provide carrier confinement to the channel layer 22'. The transition layer 18' and the back-barrier layer 20' are grown pseudomorphically on the buffer layer and are kept thin enough to prevent the formation of misfit dislocations due to the in-plane lattice mismatch between the back-barrier layer 20' and the buffer layer 16'; thinner than the critical thickness. The transition layer 18' and the back-barrier layer 20' are grown pseudomorphic and the two layers are strained so that their in-plane lattice parameters match the in-plane lattice parameter of the buffer layer material adjacent to the transition layer.

The channel layer 22' has the same in-plane lattice parameter as the buffer layer material adjacent to the transition layer 18'. A top bather layer 24' forms a heterojunction with the channel layer 22' that creates a polarization mismatch resulting in the formation of a 2DEG in the channel layer 22'. The top barrier layer 24' is grown pseudomorphically on the channel layer 22' and is kept thin enough to prevent the formation of misfit dislocations due to the in-plane lattice mismatch with the channel layer 22'; thinner than the critical thickness. The top barrier layer 24' is also grown pseudomorphically. Thus, the lattice structure of the top barrier layer 24' is strained to match the in-plane lattice constant of the channel layer 22' and the total thickness of the top bather layer 24' is less than the thickness at which misfit dislocations are nucleated to relieve strain in the top barrier layer 24' resulting from the in-plane lattice mismatch with the channel layer 22'. To put it another way, the top barrier layer 24' is grown epitaxially with a thickness less than the thickness at which misfit dislocations are nucleated to relieve strain in the epitaxial layer.

The HEMT device structure includes source, drain, and gate, electrodes, as shown in FIG. 4. The gate electrode controls the flow of the carriers passing through the channel layer 22', depending on the bias voltage, between the source, gate, and drain electrodes. It should be understood that it is the polarization mismatch at the top barrier layer 24' and the channel layer 22' heterojunction that is responsible for producing the 2DEG and the top bather layer 24' separates the junction from a gate contact used to modulate the charge in the 2DEG. The top bather layer 24' may be of one or more Group III-Nitride materials with compositions that remain fixed or vary with distance from the heterojunction between the top barrier layer 24' and the channel layer 22'. The gate contact may be directly deposited on a Group III-Nitride material in the top barrier layer 24' or separated from a Group III-Nitride material in the top barrier layer 24' by one or more electrically insulating layers, not shown.

More particularly, the pseudomorphic back-barrier double heterojunction HEMT structure 10' is here a Group III-Nitride HEMT having a SiC substrate 12' in the (0001) crystallographic orientation. HEMT 10' includes a nucleation layer 14', here for example, a 10-100 nanometers (nm) thick, epitaxially grown, Aluminum Nitride (AlN) nucleation layer, a buffer layer structure 16', here for example, a 1.0-2.0 μm thick, epitaxially grown Gallium Nitride (GaN) buffer layer, a transition layer 18', here a 12 nm thick graded transition layer, to be described below, a back barrier layer 20', here for example, a 125 nm thick, epitaxially grown, back-barrier layer of Aluminum Gallium Nitride (AlGaN), here for example, having 5% Aluminum (Al), a channel layer 22', here for example, a 10-100 nm thick GaN channel layer, a top barrier layer 24', here a 20-25 nm thick, unintentionally doped (UID) during the epitaxial growth, Aluminum Gallium Nitride (AlGaN) layer having here for example, 25-35% Aluminum (Al). The transition layer 18' is the same material as the material of the buffer layer, here GaN, at the junction with the buffer layer 16' having an increasing percentage of Aluminum as the distance within the transition layer 18' increases from the buffer layer 16' with the percentage of Aluminum increasing to the percentage of Aluminum in the back-barrier layer 20', in this example, 5%, at such distance that the transition layer 18' reaches its total thickness and forms a junction with the back-barrier layer 20'. More particularly, the transition layer 18' is grown epitaxially and the aluminum is added in increasing amounts during the growth of the transition layer 18'.

To put it another way, the transition layer 18' has a total thickness, here for example in a range from 5 to 100 nm, between an interface 19' between the transition layer 18' and the buffer layer 16' and an interface 21' between the transition layer 18' and the back-barrier layer 20'. The transition layer 18' is the same material as the material of the buffer layer 16', here GaN, at the interface 19' and has an increasing percentage of Aluminum as its distance from the interface 19' increases to the interface 21' with the back-barrier layer 20' so that the percentage of Aluminum is the same as the percentage of Aluminum in the back-barrier layer 20'. That is, the transition layer 18' is the same material as the material of the buffer layer 16', here GaN, at the interface 19' and has an increasing percentage of Aluminum with distance within the transition layer 18' from the interface 19' to the interface 21'; here for example, the percentage at Aluminum increases with such distance from 0 percent Aluminum at the interface 19' (that is, the material in the transition layer 18' at the interface 19' is GaN) to 5 percent Aluminum at the interface 21' (that is, the material in the transition layer 18' at the interface 21' is AlGaN, having 5 percent Aluminum and is now the same material as the material in the back-barrier layer 20'). Thus, the Group III-Nitride material in the transition layer 18' varies from the Group III-Nitride material in the buffer layer 16' at the interface 19' to the Group III-Nitride material in the back-barrier layer 20' at the interface 21' as a function of distance from the buffer layer 16'.

Thus, the Group III-Nitride material in the transition layer 18' varies during its epitaxial growth from the Group III-Nitride material in the buffer layer 16' to the Group III-Nitride material in the back-barrier layer 20' as a function of increasing distance from the buffer layer 16'. The composition grading of the transition layer 18' transforms the polarization discontinuity that would form from the GaN layer 16', and the AlGaN layer 20' heterojunction, without a transition layer 18', into a polarization grading confined within the transition layer 18'. Doping impurities, here for example, carbon, may also be added into the transition layer 18' to help compensate for the mobile charge generated within the transition layer 18' by the polarization mismatch. The total thickness of the transition layer 18' and back-barrier layer 20' must be below the critical thickness at which misfit dislocations become energetically favorable and begin to form, and this critical thickness decreases as the Aluminum percentage in the back-barrier layer 20', in the example here, increases. In some embodiments it is desired to keep the Aluminum concentration of the back-barrier layer 20' below 10% to keep the impurities added to the transition layer 18' sufficiently far away from the channel layer 22' so as to not significantly degrade RF performance. In some embodiments the pseudomorphic back-barrier layer 20' can be greater than 50 nm in thickness enabling the transition layer to be located more than 50 nm from the 2DEG in the channel layer.

The thickness of the transition layer 18' may also be increased to spatially spread the polarization grading and lower the compensating impurity doping concentrations required to substantially reduce mobile carriers in the transition layer 18'. Here, for example, the thickness of the transition layer 18' is in a range of 5-100 nm. The pseudomorphic AlGaN back-barrier layer is doped with p-type and/or deep level doping impurities, such as carbon, magnesium, beryllium, or iron or combinations thereof, over part or the whole back-barrier layer to reduce carrier transport within the back-barrier layer. It is noted that the doping may be uniform or non-uniform. It is also noted that the doping may be displaced from the channel layer to minimize the effect of the dopant in degradation of RF performance. The gate electrode controls the flow of the carriers passing through the GaN channel layer 22', depending on the bias voltage, between the source, gate, and drain electrodes. It should be understood that it is the polarization mismatch at the AlGaN layer 24' and the GaN channel layer 22' heterojunction that is responsible for producing the 2DEG and the AlGaN layer 24' separates the junction from a gate contact used to modulate the charge in the 2DEG. The aluminum composition of the AlGaN layer 24' may remain fixed or vary with distance from the heterojunction between the AlGaN layer 24' and the GaN channel layer 22'. The gate contact may be directly deposited on the AlGaN layer 24' or separated from the AlGaN layer 24' by a 1-3 nm GaN cap layer, not shown, one or more electrically insulating layers, not shown, for example, aluminum oxide or silicon nitride.

A number of embodiments of the disclosure have been described. Nevertheless, it will be understood that various modifications may be made without departing from the spirit and scope of the disclosure. For example, the structures in this disclosure are not dependent on the fabrication technique and one or more parts may be gown by a wide variety of growth techniques including molecular beam epitaxy, chemical beam epitaxy, chemical vapor deposition, sputtering, and e-beam evaporation. The structures in this disclosure are independent of the various varieties of source materials that can be used with different growth techniques to fabricate the layers in the disclosed structures. Further, it should be understood that other single compound substrates 12 may be used such as free standing Group III-Nitride substrates or any crystalline substrate that enables the deposition of one or more crystalline Group III-Nitride overlayers with a single well defined crystalline orientation with respect to the substrate 12 crystal structure. This includes heterojunction structures formed via the deposition of one or more crystalline materials on another crystalline material, or formed by bonding one or more layers together to define a surface region that is crystalline and supports the crystalline growth of one or more Group III nitride materials. The gate metal may be in contact with the Group III-Nitride to from a Schottky contact or include one or more dielectrics between the Group III-Nitride barrier layer and the gate metal to form a Metal-Insulator-Semiconductor HBMT. Accordingly, other embodiments are within the scope of the following claims.

What is claimed is:

1. A semiconductor structure, comprising:

a buffer layer;

a pseudomorphic back-barrier layer disposed on the buffer layer;

a channel layer disposed on a surface of the back-barrier layer, the channel layer being lattice matched to the buffer layer;

a top barrier layer disposed on the channel layer.

2. The structure recited in claim 1 including a Group III-Nitride transition layer disposed between the buffer layer and the pseudomorphic back-barrier layer; wherein the buffer layer and the pseudomorphic back-barrier layer are both Group III-Nitride materials; wherein the Group III-Nitride material of the buffer layer is different from the Group III-Nitride material in the back-barrier layer.

3. The structure recited in claim 1 wherein the buffer layer and the pseudomorphic back-barrier layer are both Group III-Nitride materials; wherein the Group III-Nitride material of the buffer layer is different from the Group III-Nitride material in the back-barrier layer.

4. The structure recited in claim 2 wherein the back-barrier layer has a wider bandgap than the buffer layer bandgap.

5. The structure recited in claim 2 wherein the Group III-Nitride material in the transition layer varies from the Group III-Nitride material in the buffer layer to the Group III-Nitride material in the pseudomorphic back-barrier layer as a function of distance from the buffer layer.

6. The semiconductor structure recited in claim 1 wherein the pseudomorphic back-barrier layer is a single-crystal material and the buffer layer is a single-crystal material different from the pseudomorphic back-barrier layer, the back-barrier layer having a lattice constant different from the lattice constant of the buffer layer, the in-plane lattice constant of the back-barrier layer being matched to the in-plane lattice constant of the buffer layer.

7. The semiconductor structure recited in claim 1 wherein the channel layer is disposed on, and in direct contact with, the surface of the pseudomorphic back-barrier layer.

8. The semiconductor structure recited in claim 1 wherein the pseudomorphic back-barrier layer is a Group III-Nitride layer.

9. A semiconductor structure, comprising:

a buffer layer;

a pseudomorphic back-barrier layer disposed on the buffer layer;

a channel layer disposed on a surface of the pseudomorphic back-barrier layer, the channel layer being lattice matched to the buffer layer;

a top barrier layer disposed on the channel layer; and a Group III-Nitride transition layer disposed between the buffer layer and the pseudomorphic back-barrier layer; and wherein the buffer layer and the pseudomorphic back-barrier layer are both Group III-Nitride materials; wherein the Group III-Nitride material of the buffer layer is different from the Group III-Nitride material in the back-barrier layer; and wherein the composition of the Group III-Nitride material in the transition layer varies from the composition of the Group III-Nitride material in the buffer layer to the composition of the Group III-Nitride material in the pseudomorphic back-barrier layer as a function of distance from the buffer layer.

10. The semiconductor structure recited in claim 9 wherein the structure has a single channel layer.

11. The semiconductor structure recited in claim 9 wherein the channel layer is disposed on, and in direct contact with, the surface of the pseudomorphic back-barrier layer.

12. A semiconductor structure, comprising:

a buffer layer;

a back-barrier layer disposed on the buffer layer, the back-barrier layer having a thickness less than a thickness to prevent the formation of misfit dislocations due to in-plane lattice mismatch between the back-barrier layer and the buffer layer;

a single channel layer disposed on a surface of the back-barrier layer, the channel layer being lattice matched to the buffer layer;

a top barrier layer disposed on the channel layer.

13. The semiconductor structure recited in claim 12 wherein the single channel layer is disposed on, and in direct contact with, the surface of the back-barrier layer.

14. The semiconductor structure recited in claim 12 wherein the back-barrier layer is a Group III-Nitride layer.

15. A semiconductor structure, comprising:

a buffer layer;

a back-barrier layer disposed on the buffer layer, the back-barrier layer having a thickness less than a thickness to prevent the formation of misfit dislocations due to in-plane lattice mismatch between the back-barrier layer and the buffer layer;

a channel layer disposed on a surface of the back-barrier layer, the channel layer being lattice matched to the buffer layer;

a top barrier layer disposed on the channel layer; and a Group III-Nitride transition layer disposed between the buffer layer and the back-barrier layer; and wherein the transition layer includes impurity doping to suppress the generation of free carriers by polarization mismatches across the transition layer.

16. The semiconductor structure recited in claim 15 wherein the channel layer is disposed on, and in direct contact with, the surface of the back-barrier layer.

17. The semiconductor structure recited in claim 15 wherein the back-barrier layer is a Group III-Nitride layer.

18. A semiconductor structure, comprising:

a buffer layer;

a back-barrier layer disposed on the buffer layer, the back-barrier layer having a thickness less than a thickness to prevent the formation of misfit dislocations due to in-plane lattice mismatch between the back-barrier layer and the buffer layer;

a single channel layer disposed on a surface of the back-barrier layer, the channel layer being lattice matched to the buffer layer and having an in-plane lattice constant;

a top barrier layer disposed on the channel layer; and wherein the back-barrier layer has a lattice structure strained to match the in-plane lattice constant of the channel layer, the total thickness of the barrier layer being less than a thickness at which misfit dislocations are nucleated to relieve strain in the barrier layer resulting from an in-plane lattice mismatch with the channel layer.

19. The semiconductor structure recited in claim 18 wherein the single channel layer is disposed on, and in direct contact with, the surface of the back-barrier layer.

20. The semiconductor structure recited in claim 18 where in the back-barrier layer is a Group III-Nitride layer.

21. A semiconductor structure, comprising:

a buffer layer;

a pseudomorphic back-barrier layer disposed on the buffer layer, the back barrier layer being entirely pseudomorphic from a bottom surface of the pseudomorphic back-barrier layer to an upper surface of the pseudomorphic back-barrier layer;

a channel layer disposed on, and in direct contact with, the upper surface of the pseudomorphic back-barrier layer, the channel layer being lattice matched to the buffer layer;

a top barrier layer disposed on the channel layer.

22. The semiconductor structure recited in claim 21 wherein the pseudomorphic back-barrier layer is a Group III-Nitride layer.

23. A structure, comprising:

a buffer layer;

a pseudomorphic back-barrier layer disposed on the buffer layer;

a single conduction channel layer disposed on, and in direct contact with, an upper surface of the pseudomorphic back-barrier layer, the channel layer being lattice matched to the buffer layer;

a top barrier layer disposed on the channel layer; and wherein the structure, have the single conducting channel, suppresses additional strain induced into the channel layer due to lattice mismatches.

24. The structure recited in claim 23 wherein the buffer layer and the channel layer are the same material.

25. The structure recited in claim 23 including a transition layer disposed between the back barrier layer and the buffer layer for suppressing formation of a 2DEG from forming at a heterojunction between the back-barrier layer and the buffer layer.

26. The structure recited in claim 23 wherein the pseudomorphic back-barrier layer is a Group III-Nitride layer.

27. A structure, comprising a buffer layer;

a channel layer, a pseudomorphically strained back-barrier layer disposed between the buffer layers and the channel layer;

wherein the channel layer has the same in-plane lattice parameter as the buffer layer;

an epitaxial top barrier layer forming a heterojunction with the channel layer creating a polarization mismatch resulting in formation of a 2DEG in the channel layer;

wherein the epitaxial top barrier layer is grown pseudomorphically on the channel layer with such epitaxial top barrier being grown with a thickness kept thin enough to prevent formation of misfit dislocations due to the in-plane lattice mismatch with the channel layer and with the epitaxial top barrier layer; and wherein the channel layer is in direct contact with the pseudomorphically strained back-barrier layer.

28. The structure recited in claim 27 wherein the epitaxial top barrier layer comprises a Group III-Nitride material.

29. The structure recited in claim 27 wherein the channel layer comprises a Group III-Nitride material.

30. The structure recited in claim 27 wherein the buffer layer is an epitaxial Group III-Nitride layer.

31. The structure recited in claim 27 wherein the pseudomorphic back-barrier layer is doped to reduce carrier transport within the back-barrier layer.

32. The structure recited in claim 27 wherein the pseudomorphically strained back-barrier layer is a Group III-Nitride layer.

* * * * *